United States Patent
Zhang et al.

(10) Patent No.: US 10,623,140 B2
(45) Date of Patent: Apr. 14, 2020

(54) METHOD FOR PROCESSING SIGNALING SUB-SEGMENT, PROCESSING APPARATUS, ACCESS POINT, AND STATION

(71) Applicant: Huawei Technologies Co., Ltd., Shenzhen, Guangdong (CN)

(72) Inventors: Jiayin Zhang, Ottawa (CA); Jun Zhu, Shanghai (CN); Jiyong Pang, Shanghai (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 102 days.

(21) Appl. No.: 15/812,903

(22) Filed: Nov. 14, 2017

(65) Prior Publication Data
US 2018/0069659 A1 Mar. 8, 2018

Related U.S. Application Data

(63) Continuation of application No. PCT/CN2015/079119, filed on May 15, 2015.

(51) Int. Cl.
*H04L 1/00* (2006.01)
*H04W 72/00* (2009.01)
(Continued)

(52) U.S. Cl.
CPC ........ *H04L 1/0061* (2013.01); *H03M 13/091* (2013.01); *H04L 1/0041* (2013.01);
(Continued)

(58) Field of Classification Search
CPC ... H04L 1/0061; H04L 1/0059; H04L 1/0041; H03M 13/091; G06F 11/1004; H04W 72/00
See application file for complete search history.

(56) References Cited

U.S. PATENT DOCUMENTS

| | | |
|---|---|---|
| 2011/0283105 A1 | 11/2011 | Lee et al. |
| 2015/0250003 A1 | 9/2015 | Seok et al. |

(Continued)

FOREIGN PATENT DOCUMENTS

| | | |
|---|---|---|
| CN | 102142848 A | 8/2011 |
| CN | 103001729 A | 3/2013 |

(Continued)

OTHER PUBLICATIONS

Kwon et al.; "SIG field design principle for 11ax"; Doc: IEEE 802.11-15/0344r2; Mar. 9, 2015; 18 pages.

*Primary Examiner* — Cynthia Britt
(74) *Attorney, Agent, or Firm* — Womble Bond Dickinson (US) LLP

(57) ABSTRACT

A method is provided, including: receiving a to-be-decoded signaling sub-segment, where the to-be-decoded signaling sub-segment includes one or more to-be-decoded sequences D0; obtaining a local ID sequence N2 with an N-bit length according to ID information stored on a receive end; for each to-be-decoded sequence D0, setting an initial state and a final state of a decoder to a reference state sequence with a T length and obtaining a decoded sequence D1, where at least some bits in the reference state sequence are identical to some bits in the obtained local ID sequence N2, referred to as a specific reference state sequence in short; and performing processing according to a decoding result.

9 Claims, 14 Drawing Sheets

(51) Int. Cl.
 *H03M 13/09* (2006.01)
 *G06F 11/10* (2006.01)
(52) U.S. Cl.
 CPC ........... *H04L 1/0059* (2013.01); *H04W 72/00* (2013.01); *G06F 11/1004* (2013.01)

(56) References Cited

U.S. PATENT DOCUMENTS

| | | | | |
|---|---|---|---|---|
| 2016/0134878 | A1* | 5/2016 | Cheung | H04N 19/91 375/240.23 |
| 2016/0315793 | A1* | 10/2016 | Chen | H04L 5/0064 |
| 2017/0063507 | A1* | 3/2017 | Yan | H04L 29/02 |

FOREIGN PATENT DOCUMENTS

| | | |
|---|---|---|
| CN | 103828265 A | 5/2014 |
| EP | 2131502 A2 | 12/2009 |

* cited by examiner

METHOD FOR PROCESSING SIGNALING SUB-SEGMENT, PROCESSING APPARATUS, ACCESS POINT, AND STATION

CROSS-REFERENCE TO RELATED APPLICATIONS

This application is a continuation of International Application No. PCT/CN2015/079119, filed on May 15, 2015, the disclosure of which is hereby incorporated by reference in its entirety.

TECHNICAL FIELD

The present application relates to the field of wireless communications technologies, and more specifically, to a method for processing a signaling sub-segment, a processing apparatus, an access point, and a station.

BACKGROUND

A wireless local area network (WLAN) is a data transmission system. The wireless local area network uses a radio frequency technology to replace a local area network that is constructed by old copper twisted pairs, so that the wireless local area network can use a simple access architecture to allow users to achieve an information transmission purpose via the wireless local area network. Development and application of the WLAN technology have profoundly changed the way people communicate and work, bringing people unprecedented convenience. With wide application of intelligent terminals, people's demands for data network traffic are ever growing. WLAN's development is inseparable from formulation, promotion, and application of its standards. The IEEE802.11 series are the main standards, including mainly 802.11, 802.11b/g/a, 802.11n, 802.11ac, and 802.11ax that is under development.

SUMMARY

Embodiments of the present disclosure provide a method for transmitting information, an access point, and a station, so as to efficiently indicate a time-frequency resource to the station.

In one aspect, an implementation of the present disclosure provides a method for processing signaling, where the method is applied in a wireless local area network using an OFDMA technology, and specifically includes:

processing a to-be-encoded signaling sub-segment, where the processed signaling sub-segment includes one or more individual coding sequences S2, where each processed individual coding sequence S2 includes a first part and includes a second part with an N-bit length, and the second part is a sequence obtained according to an identifier sequence N1, with an N-bit length, that is related to the individual coding segment; and for each individual coding sequence S2, setting an initial state of an encoder to a tail bit sequence with a T length and performing encoding, where T bits at a tail of the individual coding sequence S2 are the tail bit sequence, and at least some bits in the tail bit sequence are identical to some bits in the identifier sequence N1, referred to as a specific tail bit sequence in short.

Accordingly, in another aspect, on a receive end, the method includes:

receiving a to-be-decoded signaling sub-segment, where the to-be-decoded signaling sub-segment includes one or more to-be-decoded sequences D0;

obtaining a local ID sequence N2 with an N-bit length according to ID information stored on a receive end;

for each to-be-decoded sequence D0, setting an initial state and a final state of a decoder to a reference state sequence with a T length and obtaining a decoded sequence D1, where at least some bits in the reference state sequence are identical to some bits in the obtained local ID sequence N2, referred to as a specific reference state sequence in short; and performing processing according to a decoding result.

However, in this implementation, in one aspect, unlike an existing BCC encoding/decoding scheme, no extra all-zero tail bits are required and signaling overhead is reduced. In another aspect, also unlike an existing TBCC encoding/decoding scheme, for a target receive end, an initial state and a final state of a decoder in this implementation are set to a reference state sequence that is at least partially known. Therefore, it is only required that the initial state of the decoder be set to the reference state sequence and then a common Viterbi decoding method be used. This reduces paths that need to be searched and thereby improves decoding performance.

BRIEF DESCRIPTION OF THE DRAWINGS

To describe the technical solutions in the embodiments of the present disclosure more clearly, the following briefly describes the accompanying drawings required for describing the embodiments of the present disclosure. Apparently, the accompanying drawings in the following description show merely some embodiments of the present disclosure, and a person of ordinary skill in the art may still derive other drawings from these accompanying drawings without creative efforts.

DETAILED DESCRIPTION

The following clearly describes the technical solutions in the embodiments of the present disclosure with reference to the accompanying drawings in the embodiments of the present disclosure. Apparently, the described embodiments are a part rather than all of the embodiments of the present disclosure. All other embodiments obtained by a person of ordinary skill in the art based on the embodiments of the present disclosure without creative efforts shall fall within the protection scope of the present disclosure.

An access point (AP), also known as a wireless access point, a bridge, or a hot spot, may access a server or a communications network.

A station (STA), also known as a user, may be a wireless sensor, a wireless communications terminal, or a mobile terminal, such as a mobile phone (or known as a cell phone) that supports a Wi-Fi communication function or a computer that has a wireless communication function. For example, it may be a portable, pocket-sized, handheld, computer's built-in, wearable, or vehicle-mounted wireless communications apparatus that exchanges communication data such as voice and data with a radio access network. Sometimes, one communications apparatus may include the functions of both the foregoing access point and station.

Figure 1:
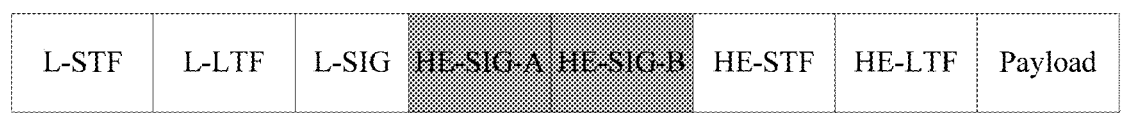
FIG. 1 is a schematic diagram of a possible PPDU frame format in a next-generation Wi-Fi standard.

FIG. 1 is a diagram of a possible PPDU frame format in a next-generation Wi-Fi standard (such as 802.11ax standard), where a high-efficiency signal field HE-SIG is classified into two fields: HE-SIG-A and HE-SIG-B.

Generally, the HE-SIG-B field carries signaling information related to a scheduled site, for example, resource allocation signaling as well as modulation and coding signaling. Currently, there are two possible HE-SIG-B structures. One is a station-based indication manner, and the other is a RU-allocation-based indication manner.

Figure 2:
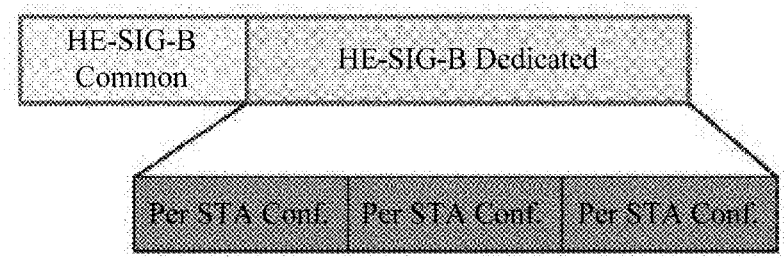
FIG. 2 is a schematic diagram of an HE-SIG-B in an embodiment of the present disclosure.

For the station-based indication manner, as shown in FIG. 2, an HE-SIG-B includes a common part and a dedicated part. The common part includes a BSS ID, a number of LTF symbols, a data transmission GI, or like signaling, while the dedicated part includes multiple station-based user information fields that are of a fixed length. Each user information field includes an AID, RU allocation, an MCS, a quantity of space-time flows, and like signaling.

Figure 3:
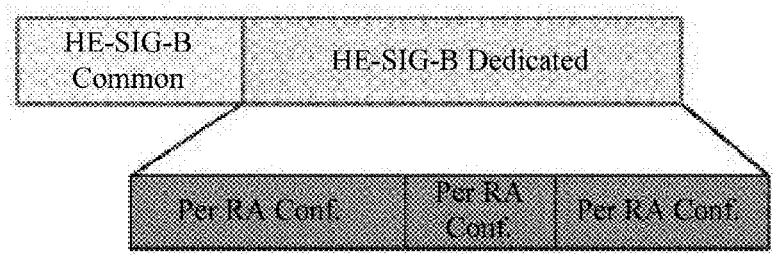
FIG. 3 is a schematic diagram of an HE-SIG-B in an embodiment of the present disclosure.

For the RU-allocation-based indication manner, as shown in FIG. 3, an HE-SIG-B includes a common part and a dedicated part. The common part includes RU allocation signaling in addition to a BSS ID, a quantity of LTF symbols, a data transmission GI, and like signaling, while the dedicated part includes multiple RU information fields of variable lengths. Each RU information field includes a corresponding AID or GID, a corresponding MCS, a quantity of space-time flows, and like signaling.

Figure 4:
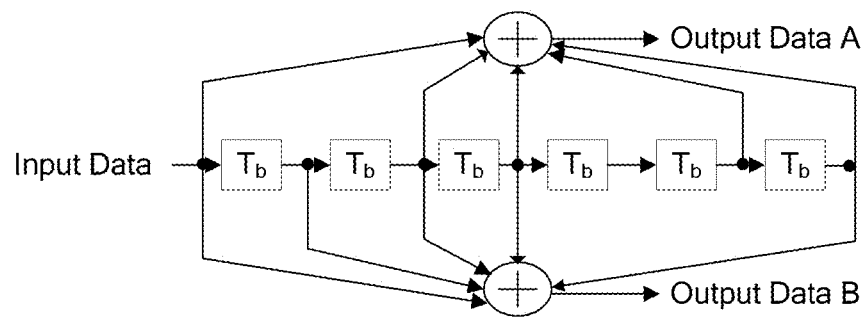
FIG. 4 is a schematic structural diagram of an existing encoder.
Figure 5:
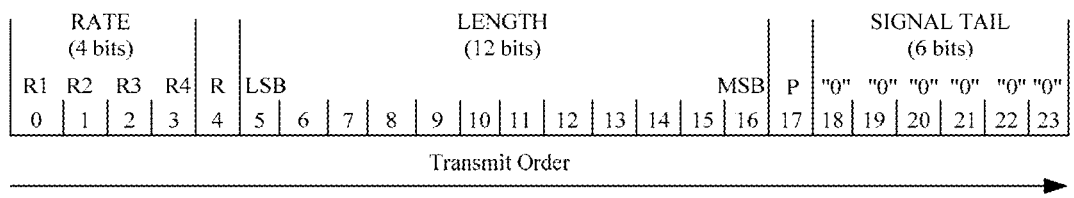
FIG. 5 is a schematic diagram of bit allocation for an existing L-SIG field.

In an existing Wi-Fi standard, each signaling sub-segment (such as L-SIG, VHT-SIG-A, and VHT-SIG-B) is an individual coding sequence, which uses an encoder structure shown in FIG. 4 for convolutional BCC coding. The encoder includes six shift registers, and its initial state is all-zero. Six all-zero bits are added to tails of all the individual coding sequences as a tail bit sequence. FIG. 5 shows bit allocation for an existing L-SIG field. A purpose of the all-zero tail bit sequence is to make a final state of the six shift registers of the encoder back to all-zero after each encoding.

Figure 6:
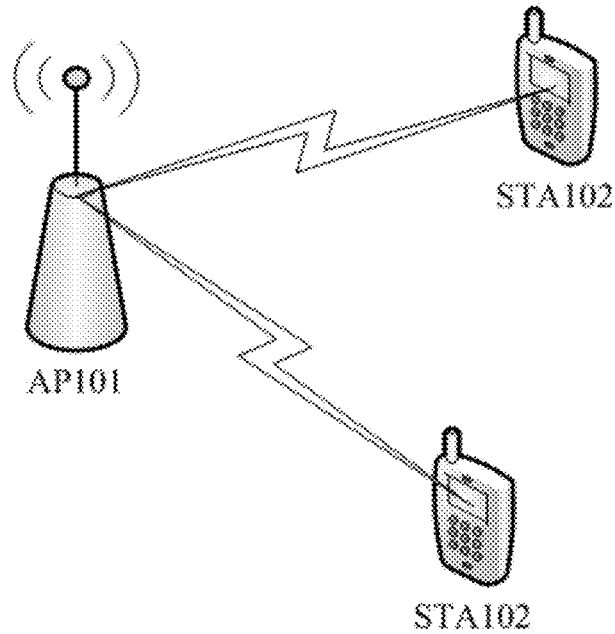
FIG. 6 is a simple schematic diagram of a WLAN system in an embodiment of the present disclosure.

FIG. 6 is a simple schematic diagram of a WLAN system applied by an implementation of the present disclosure. The system in FIG. 6 includes one or more access points AP 101 and one or more stations STA 102. An OFDMA technology is used for wireless communications between the access point 101 and the station 102. The access point 101 processes to-be-encoded signaling and makes best effort to ensure that a tail bit sequence of each individual coding segment is in a to-be-encoded signaling sub-segment known on a receive end, so that an initial state (that is, the tail bit sequence in use) of a decoder is at least partially known when the station 102 on the receive end is performing decoding. This can improve decoding performance.

The foregoing signaling sub-segment includes but is not limited to the high-efficiency signal field HE-SIGB or an HE-SIGC.

Specifically, an implementation of the present disclosure provides a method for processing signaling, where the method is applied in a wireless local area network using an OFDMA technology and specifically includes the following steps.

1001: Process a to-be-encoded signaling sub-segment, where the processed signaling sub-segment includes one or more individual coding sequences S2.

Each processed individual coding sequence S2 includes a first part and includes a second part with an N-bit length, and the second part is a sequence obtained according to an identifier sequence N1, with an N-bit length, that is related to the individual coding segment.

1003: For each individual coding sequence S2, set an initial state of an encoder to a tail bit sequence with a T length and perform encoding, where T bits at a tail of the individual coding sequence S2 are the tail bit sequence, and at least some bits in the tail bit sequence are identical to some bits in the identifier sequence N1, referred to as a specific tail bit sequence in short.

Specifically, the individual coding mentioned in 1001 specifically means that the initial state of the encoder is reset according to the tail bit sequence in 1001 for encoding of each to-be-encoded individual coding segment (also known as an individual coding sequence or individual coding signaling).

Accordingly, on a receive end, the following steps are included:

2000: Receive a to-be-decoded signaling sub-segment, where the to-be-decoded signaling sub-segment includes one or more to-be-decoded sequences D0.

2002: Obtain a local ID sequence N2 with an N-bit length according to ID information stored on the receive end.

2004: For each to-be-decoded sequence D0, set an initial state and a final state of a decoder to a reference state sequence with a T length and obtain a decoded sequence D1, where at least some bits in the reference state sequence are identical to some bits in the obtained local ID sequence N2, referred to as a specific reference state sequence in short. (202, 402, 602)

2006: Perform processing according to a decoding result.

A person skilled in the art knows that in a current related Wi-Fi standard, for example, 802.11ac, as referred to in the background, a convolutional code (BCC) technology is used. In this implementation, however, a special tail-biting convolution code (TBCC) technology is used instead of the convolutional code technology.

In the existing TBCC technology, T all-zero bits are not added to a tail of an individual coding sequence as a tail bit sequence. That is, an initial state of an encoder is not set to T all-zero bits but set to the last T bits of the individual coding sequence itself. These last T bits are unknown to a target receive end. However, the tail bit sequence in this implementation is at least partially known to the target receive end.

On the receive end, in the existing TBCC technology, decoded bits are obtained through re-estimation and capture of cyclically encoded bits. Compared with the BCC with a known initial state, there is loss of decoding performance.

However, in this implementation, in one aspect, unlike an existing BCC encoding/decoding scheme, no extra all-zero tail bits are required and signaling overhead is reduced. In another aspect, also unlike an existing TBCC encoding/decoding scheme, for a target receive end, an initial state and a final state of a decoder in this implementation are set to a reference state sequence that is at least partially known. Therefore, it is only required that the initial state of the decoder be set to the reference state sequence and then a common Viterbi decoding method be used. This reduces paths that need to be searched and thereby improves decoding performance.

In a preferred implementation, further, on the transmit side, a CRC sequence corresponding to each individual coding segment (also known as an individual coding sequence) is used as a mask, and encoding is performed after an XOR operation is performed on this mask and some bits in an ID sequence (for example, a normal-order sequence or a reverse-order sequence of an AID sequence or a PAID sequence) corresponding to each individual coding segment. On the receive end, corresponding reverse processing is performed, and accordingly, a CRC sequence and an ID sequence can be obtained from decoding. In this way, communication signaling overhead can be further reduced.

More specifically, the individual coding sequences in the foregoing signaling sub-segment are generally different and carry or correspond to different IDs. However, the individual coding sequences may be the same in very occasional cases. Specifically, for example, the individual coding segment may be a common part of a signaling sub-segment (for example, the HE-SIGB), and an identifier included in the sequence is an identifier that may be used to identity a basic service set that the access point is in, for example, a BSSID, a partial BSSID (PBSSID), or a BSS color.

For another example, the individual coding segment is any dedicated information field (for example, a user information field or an RU information segment. Refer to the background for details) in a dedicated part (dedicated part) of a signaling sub-segment (for example, the HE-SIGB). The identifier is an identifier that may be used to identify one or more stations scheduled by the access point, for example, an Association ID (AID), a Partial AID (PAID), or a Group ID (GID). The GID is an identifier used to identify any station group scheduled by the access point, and the site group includes one or more stations.

A person skilled in the art easily understands that, the first part (refer to a blank part of S2 shown in FIG. 7a to FIG. 9b) of each processed individual coding sequence S2 in the foregoing solution is not the object of focus in these implementations, and content of the first part is not limited or detailed. For ease of understanding, refer to description about an example using the HE-SIG-B field in the background.

Specifically, there are multiple possibilities for N, T, and R in the foregoing method. Therefore, according to their different conditions, specific conditions of bits in the foregoing individual coding segment may be different.

Figure 7A:
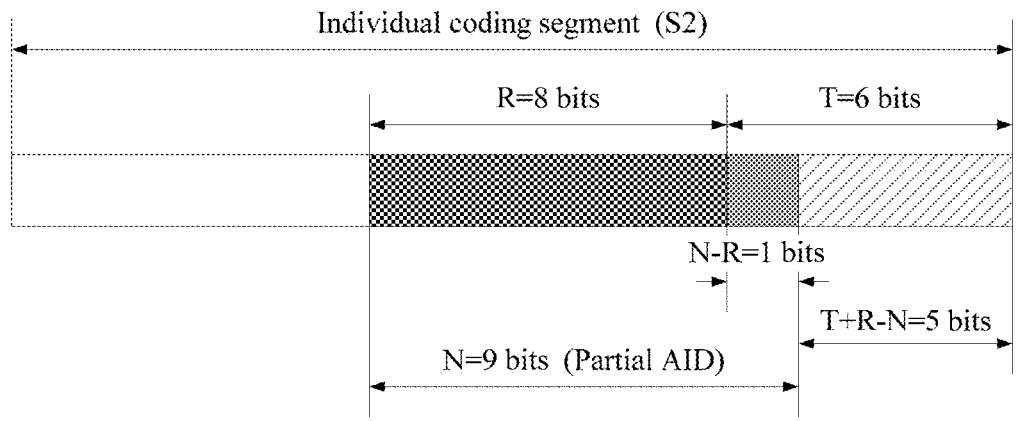
FIGS. 7a, 7b, 8a, 8b, 9a and 9b are each a schematic diagram of bits in a signaling sub-segment in an embodiment of the present disclosure.
Figure 7B:
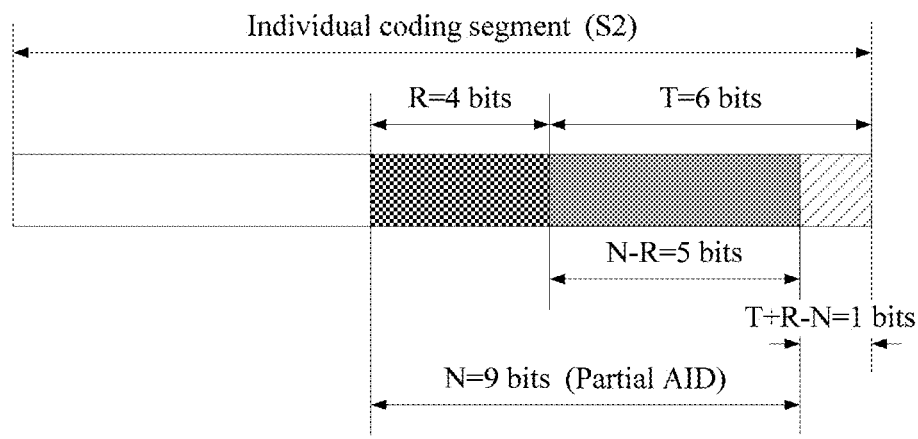

For example, N is less than a sum of T and R (N<T+R), and the individual coding sequence S2 further includes added bits located after the second part. A length of the added bits (or known as an added sequence) is a difference between the sum of T and R and N, and a length of the specific tail bit sequence is a difference between N and R. Preferably, the added bits are bits known to the receive end, for example, all zeros. Refer to FIG. 7a and FIG. 7b which are specific examples. As shown in FIG. 7a, N=9 bits, R=8 bits, and T=6 bits. As shown in FIG. 7b, N=9 bits, R=4 bits, and T=6 bits. A white part in FIG. 7a or FIG. 7b is the foregoing first part, a grid part is a multiplex sequence, a gray part is specific tail bits, and a slashed part is an added sequence.

Figure 8A:
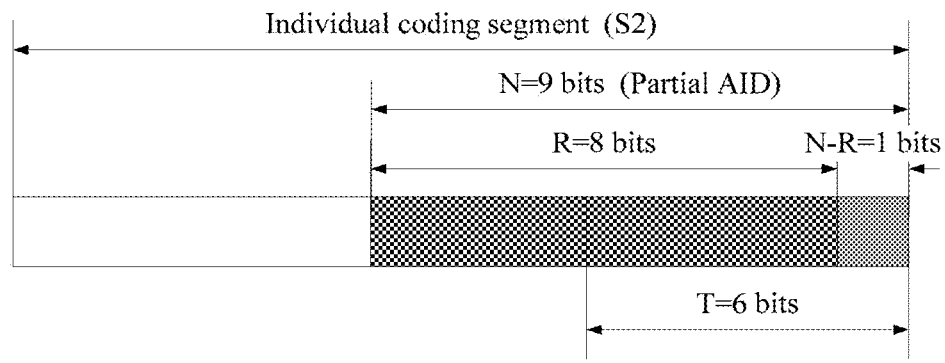
Figure 8B:
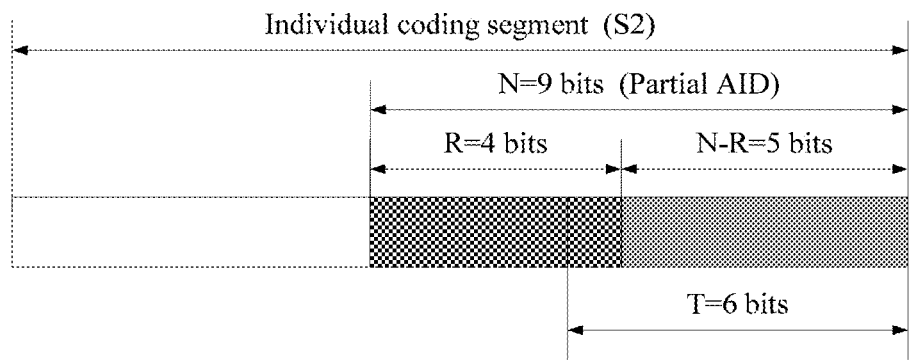

For another example, N is less than a sum of T and R (N<T+R), and the specific tail bit sequence is a sequence whose length is a difference between N and R and that is at a tail of the tail bit sequence. Refer to FIG. 8a and FIG. 8b, which are specific examples. As shown in FIG. 8a, N=9 bits, R=8 bits, and T=6 bits. As shown in FIG. 8b, N=9 bits, R=4 bits, and T=6 bits. A white part in FIG. 8a or FIG. 8b is the foregoing first part, a grid part is a multiplex sequence, and a gray part is specific tail bits.

Figure 9A:
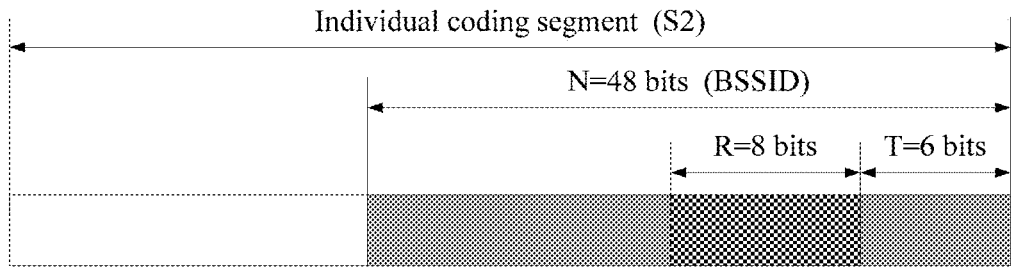
Figure 9B:
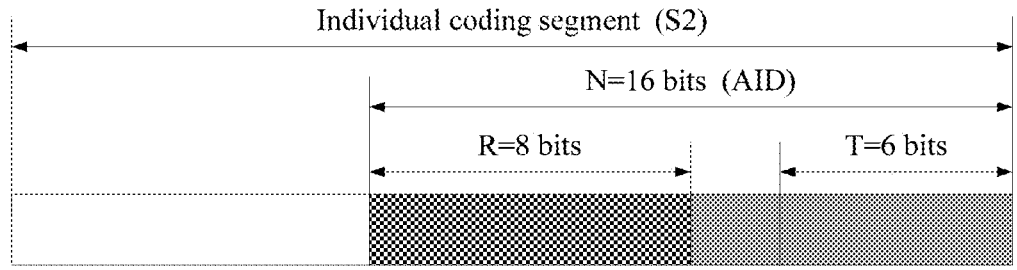

For another example, N is greater than a sum of T and R (N>T+R), the specific tail bit sequence is all bits in the tail bit sequence, and the second part further includes other bits identical to remaining bits of the identifier. Refer to FIG. 9a and FIG. 9b, which are specific examples. As shown in FIG. 9a, N=48 bits, R=8 bits, and T=6 bits. As shown in FIG. 9b, N=16 bits, R=8 bits, and T=6 bits. A white part in FIG. 9a or FIG. 9b is the foregoing first part, a grid part is a multiplex sequence, and a gray part at the tail is tail bits.

For another example, in a special case, N is equal to a sum of T and R (N=T+R), and the specific tail bit sequence is all bits in the tail bit sequence.

More specifically, the specific tail bit sequence is specifically bits identical to normal-order high-order bits of the identifier or bits identical to reverse-order low-order bits of the identifier. In other words, specifically, if bits of the identifier are B1, B2, B3, . . . , Bn−2, Bn−1, and Bn, the specific tail bit sequence is Bn−s, . . . , Bn−2, Bn−1, and Bn (high-order bits in a normal order) or B1+s, . . . , B3, B2, and B1 (low-order bits in a reverse order).

As mentioned in the foregoing implementations, an R-bit sequence in a protocol-defined N1 may be any sub-sequence located before a specific tail bit sequence, simply the $1^{st}$ to the $R^{th}$ bits in the N1, or R bits immediately preceding the specific tail bit sequence. The sub-sequence may alternatively be a sequence including R nonconsecutive information bits in the N1 or a sequence with an odd-numbered R-bit length. The implementations are not limited.

The foregoing processing a to-be-encoded signaling sub-segment includes a method for processing each individual coding sequence. To make the foregoing solution clearer, the following introduces embodiments of several possible methods for processing an individual coding sequence on a transmit side and corresponding processing methods on a receive end.

Embodiment 1

A dedicated part of an HE-SIG-B is used as an example. Each segment of station-based or RU-based configuration information is an individual coding segment, and a partial AID the segment carries is a sequence of an N=9 bits length. If R=8 and T=6, N<T+R. If R=4 and T=6, still N<T+R.

Figure 10:
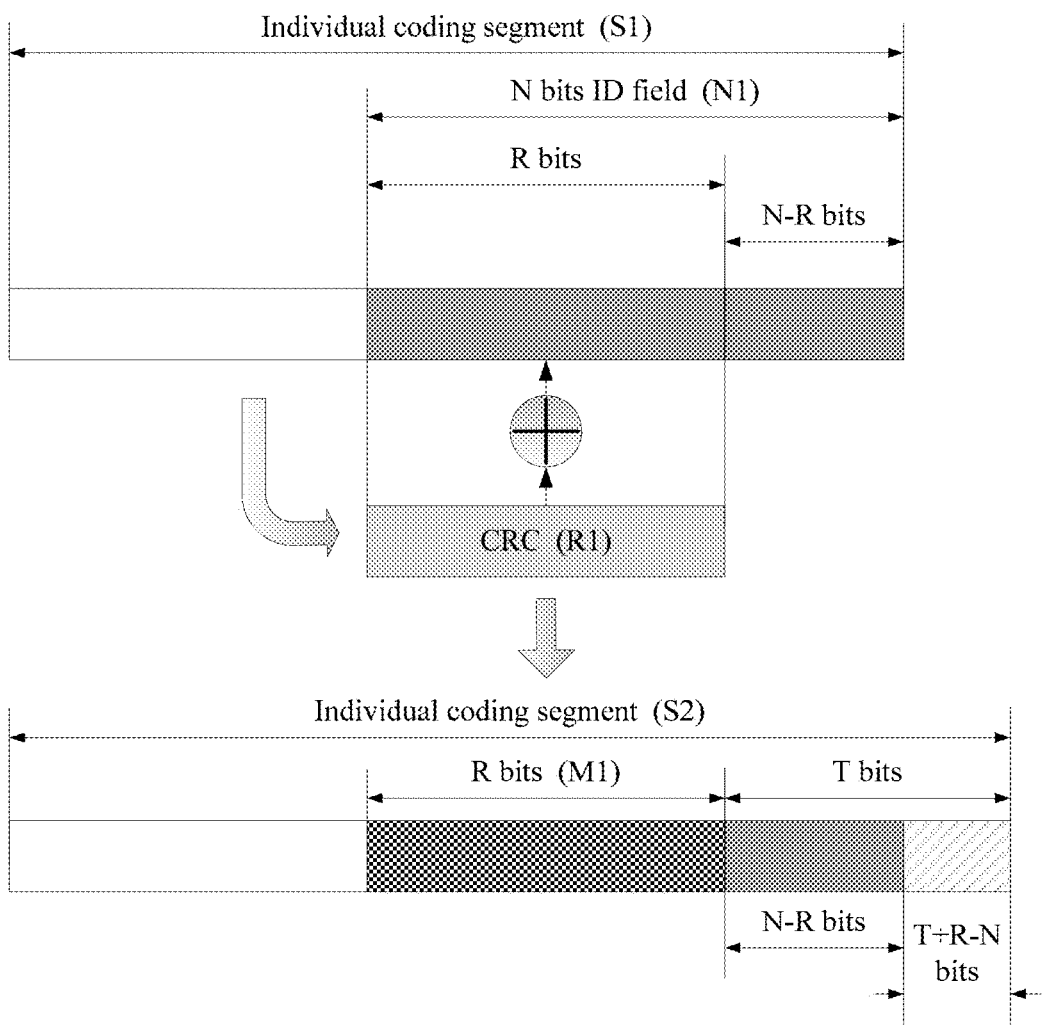
FIGS. 10-17 are each a schematic diagram of a working principle for a transmit side or a receive end in an embodiment of the present disclosure.

Referring to a schematic diagram shown in FIG. 10, in Embodiment 1, at an AP side, 100: Determine a to-be-processed individual coding sequence (individual coding segment) S1, including a first part (a blank part of S1 in FIG. 10) and an identifier sequence N1. Content of the first part is not limited or detailed. The N-bit (for example, N=12 or N=9) identifier sequence N1 is at a tail of the individual coding sequence S1.

It should be understood that the identifier sequence N1 is obtained according to an original AID sequence or a PAID sequence that is related to the individual coding sequence, for example, a normal-order original ID sequence N0 or a reverse-order original ID sequence N0. A processing procedure for the latter includes arranging the original ID sequence N0 first in a reverse order and then placing the reverse-order sequence at a tail of the sequence S1, the reverse-order sequence denoted as the sequence N1.

102: Generate an R-bit (for example, R=8) CRC sequence R1 according to the to-be-processed individual coding sequence S1.

104: Perform a logical bitwise operation (for example, an XOR operation) on a protocol-defined R-bit sequence (for example, the $1^{st}$ to the $R^{th}$ bits, or R bits in another position) in the identifier sequence N1 and the CRC sequence R1 to obtain an R-bit multiplex sequence M1.

106: Substitute the multiplex sequence M1 for the protocol-defined R information bits (preferably, the $1^{st}$ to the $R^{th}$ bits) in the identifier sequence N1 and add (T+R-N) all-zero bits to a tail of the sequence N1, to obtain a processed individual coding sequence S2.

108: Set an initial state of a shift register of a TBCC encoder to the last T information bits (a tail bit sequence) of the processed individual coding sequence S2 and perform TBCC encoding on the individual coding segment, to obtain an encoded sequence S3. At this point, a person skilled in the art may know that the tail bit sequence includes the $(R+1)^{th}$ to the $N^{th}$ bits in the identifier sequence N1 and (T+R-N) all-zero bits.

Figure 11:
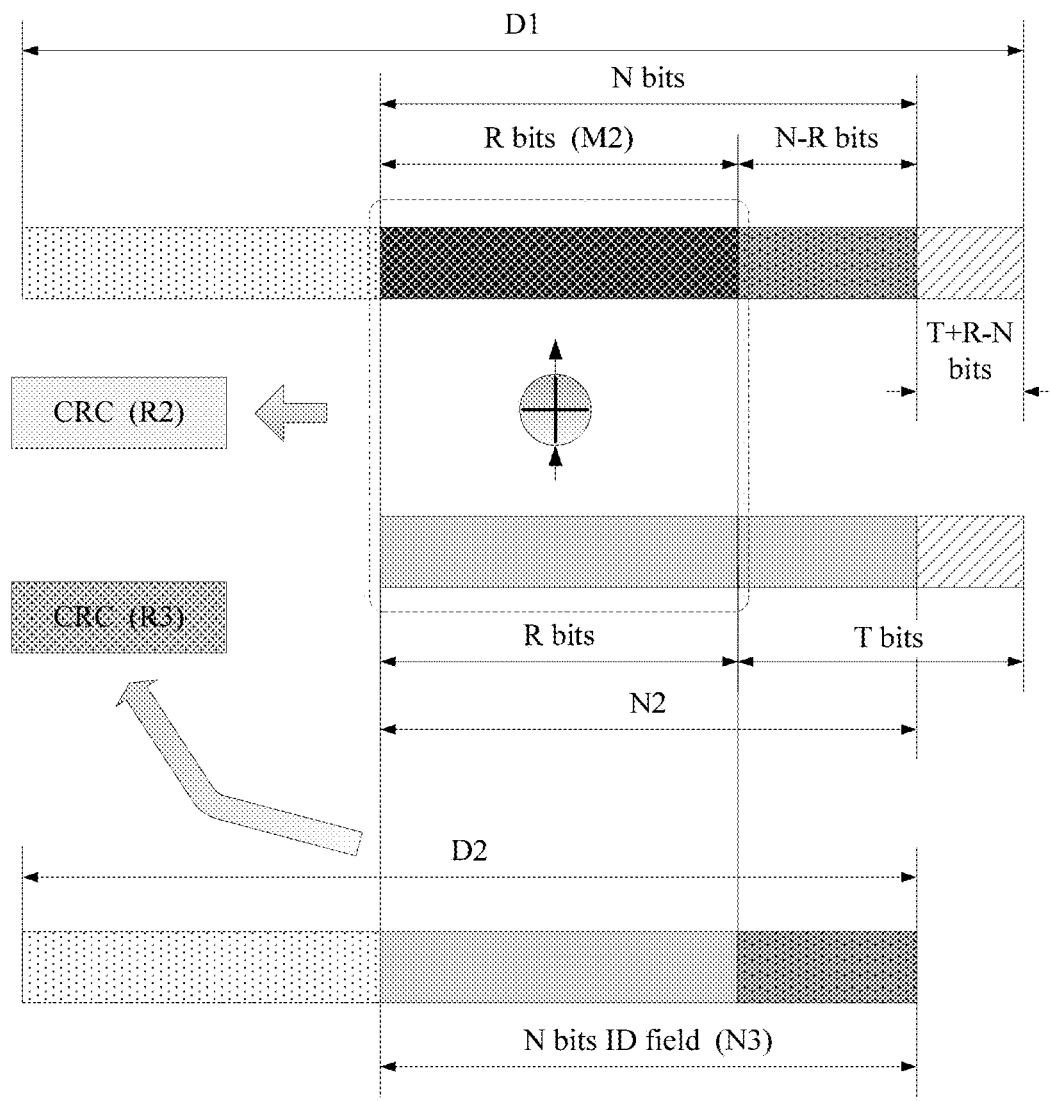

Referring to a schematic diagram shown in FIG. 11, in Embodiment 1, at an STA side,

200-201: Receive a to-be-decoded sequence D0 and obtain a local ID sequence N2 according to ID information stored on a receive end.

The local ID sequence N2 is a normal-order sequence obtained according to an original ID sequence N0 of an identifier corresponding to the receive end, or is a reverse-order sequence of the original ID sequence N0.

203: Perform TBCC decoding on the to-be-decoded individual coding segment D0 by using a reference state sequence with a T length to obtain a decoded sequence D1, where the reference state sequence includes some bits in the local ID sequence N2. That is, at least some bits in the used reference state sequence are known, thereby improving decoding performance.

In a specific example, the reference state sequence includes the $(R+1)^{th}$ to the $N^{th}$ bits in the local ID sequence N2 and (T+R-N) all-zero bits. An initial state and a final state of a shift register of a BCC decoder are set to the reference state sequence, and decoding is performed on the received individual coding segment D0 to obtain the decoded sequence D1.

205: A protocol-defined sequence of an R length in the decoded sequence D1 is a multiplex sequence M2. For example, as protocol-defined, the $1^{st}$ to the $R^{th}$ bits in (T+R) bits at the tail is the multiplex sequence M2. Perform a logical reverse operation (for example, an XOR operation) on the multiplex sequence M2 and a protocol-defined R-bit sequence (preferably the protocol-defined $1^{st}$ to $R^{th}$ bits) of the local ID sequence N2, to obtain an R-bit CRC sequence R2.

207: Substitute the protocol-defined sequence of an R length in the local ID sequence N2 for the multiplex sequence M2 (for example, the $1^{st}$ to the $R^{th}$ bits in the sequence N1) and remove (T+R-N) bits at a tail of the decoded sequence D1, to obtain an information sequence D2 used for reference, of which a last sequence whose length is N bits is a reference sequence N3. Generate an R-bit reference CRC sequence R3 according to the sequence D2 used for reference.

209: Perform subsequent processing according to conditions of the obtained CRC sequence R2 and the reference CRC sequence R3.

Specifically, if the obtained CRC sequence R2 is identical to the reference CRC sequence R3, the sequence D2 is an information sequence required by the receive end and the receive end proceeds to other processing. Otherwise, the sequence D2 is an information sequence not required by the receive end. Generally, when the receive end does not need the information sequence, the information sequence D2 may be discarded, or the processing may be stopped.

In this implementation, on one hand, communication signaling overhead can be reduced; on the other hand, the entire tail bit sequence is known bits, and decoding performance is further improved.

Embodiment 2

A dedicated part of an HE-SIG-B is used as an example. Each segment of station-based or RU-based configuration information is an individual coding segment, and a Partial AID the segment carries is a sequence of an N=9 bits length. If R=8 and T=6, N<T+R. If R=4 and T=6, still N<T+R.

Figure 12:
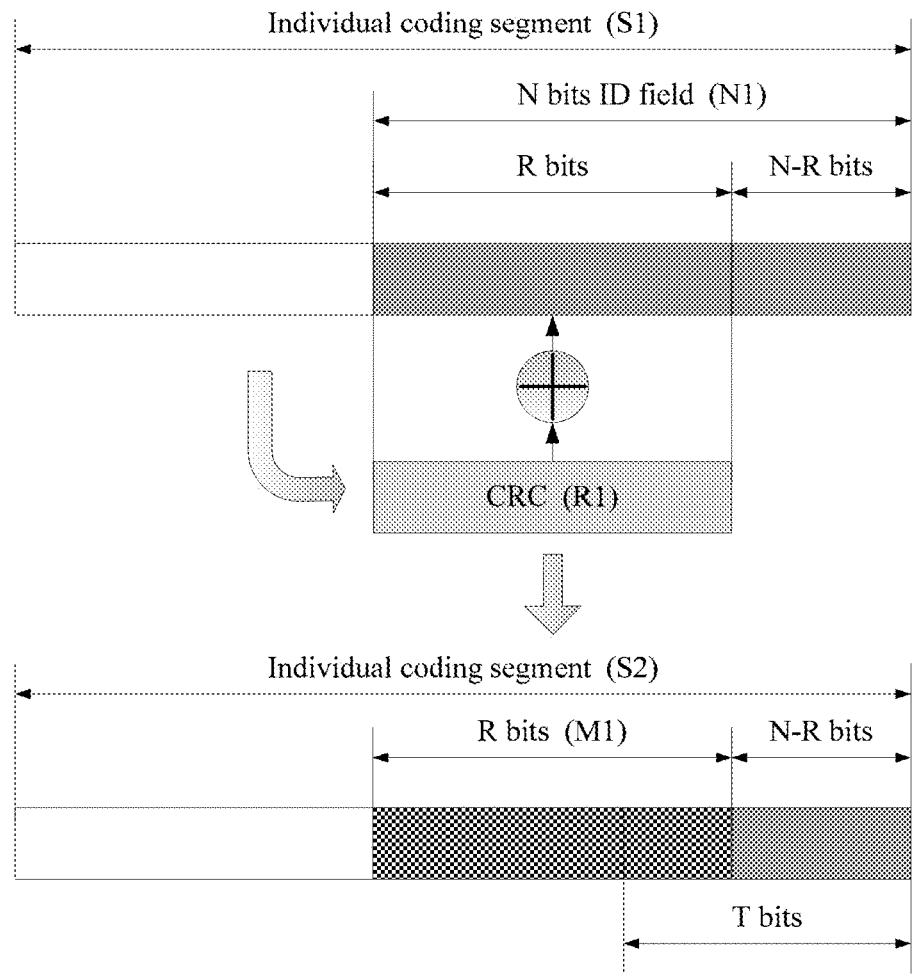

Referring to a schematic diagram shown in FIG. 12, in Embodiment 2, at an AP side,

300: Determine a to-be-processed individual coding sequence (English: individual coding segment) S1, including a first part (a blank part of S1 in FIG. 12) and an identifier sequence N1 (a gray part of S1 in FIG. 12).

Content of the first part is not limited or detailed. An N-bit (for example, N=12 or N=9) A identifier sequence N1 is at a tail of the individual coding sequence S1. It should be understood that the A identifier sequence N1 may be a normal-order original ID sequence N0 or a reverse-order original ID sequence N0.

302: Generate an R-bit (for example R=8) CRC sequence R1 according to the individual coding sequence S1.

304: Perform a logical bitwise operation (for example, an XOR operation) on a protocol-defined R-bit sequence (preferably the protocol-defined $1^{st}$ to $R^{th}$ bits, or R bits in any other position) in the identifier sequence N1 and the CRC sequence R1, to obtain an R-bit multiplex sequence M1.

306: Substitute the multiplex sequence M1 for the protocol-defined R (for example, the $1^{st}$ to the $R^{th}$ bits) information bits in the identifier sequence N1 to obtain a processed individual coding sequence S2.

308: Set an initial state of a shift register of a BCC encoder to the last T information bits of the processed individual coding sequence S2, and perform TBCC encoding on the individual coding segment, to obtain an encoded sequence S3.

In Embodiment 2, at an STA side,

400-401: Receive a to-be-decoded sequence D1 and obtain an N-bit local ID sequence N2 according to ID information (for example, a PAID) stored on a receive end.

The local ID sequence N2 is a normal-order sequence of original ID information or a reverse-order sequence of original ID information.

402: Perform TBCC decoding by using a reference state sequence with a T length to obtain a decoded sequence D1. At least some bits in the reference state sequence are identical to some bits in the obtained local ID sequence N2, referred to as a specific reference state sequence in short.

For example, the reference state sequence includes a (T+R-N)-bit random sequence and a sequence of a protocol-defined (N-R)-bit length in the local ID sequence N2 (for example, the $(R+1)^{th}$ to the $N^{th}$ bits in the local ID sequence N2). An initial state and a final state of a shift register of a BCC decoder are set to the reference state sequence and decoding is performed on the received individual coding segment to obtain the decoded sequence D1, where protocol-defined R bits (for example, the $1^{st}$ to the $R^{th}$ bits of N bits at a tail) in the sequence D1 are a multiplex sequence M2.

403: Perform a logical reverse operation (for example, an XOR operation) on the multiplex sequence M2 and a protocol-defined R-bit sequence (for example, the $1^{st}$ to the $R^{th}$ bits in the N1) of the local ID sequence N2, to obtain an R-bit CRC sequence R2.

404: Substitute the protocol-defined R bits (for example, the $1^{st}$ to the $R^{th}$ bits in the N1) of the local ID sequence N2 for the M2 sequence to obtain an information sequence D2 used for reference, where an N-bit sequence at a tail of the sequence D2 is a reference sequence N3. Generate an R-bit CRC sequence R3 according to the sequence D2.

405: Perform processing according to the obtained CRC sequence R2 and the reference CRC sequence R3, as well as conditions of the local ID sequence N2 and the reference sequence N3.

Specifically, if the obtained CRC sequence R2 is identical to the reference CRC sequence R3 and the local ID sequence N2 is identical to the reference sequence N3, the sequence D2 is an information sequence required by the receive end and the receive end proceeds to subsequent processing. Otherwise, the sequence D2 is an information sequence not required by the receive end, and the information sequence D2 may be discarded or the processing may be stopped.

Compared with Embodiment 1, an extra tail bit sequence does not need to be added to each individual coding segment in Embodiment 2, reducing overhead in the case of a large quantity of individual coding segments. However, in comparison, because some bits in the initial and final states of the decoder are unknown, decoding performance is lower than that in Embodiment 1.

Embodiment 3

A common part of an HE-SIG-B is used as an example. The common part is an individual coding segment and a BSS ID the segment carries is an ID sequence of an N=48 bits length. In this case, N>T+R.

Similarly, a dedicated part of an HE-SIG-B is used as an example. Each segment of station-based or RU-based configuration information in the dedicated part may be an individual coding segment, and an AID the segment carries is a sequence of an N=16 bits length. If a CRC sequence of an R=4 bits length is used, still N>T+R.

Figure 13:
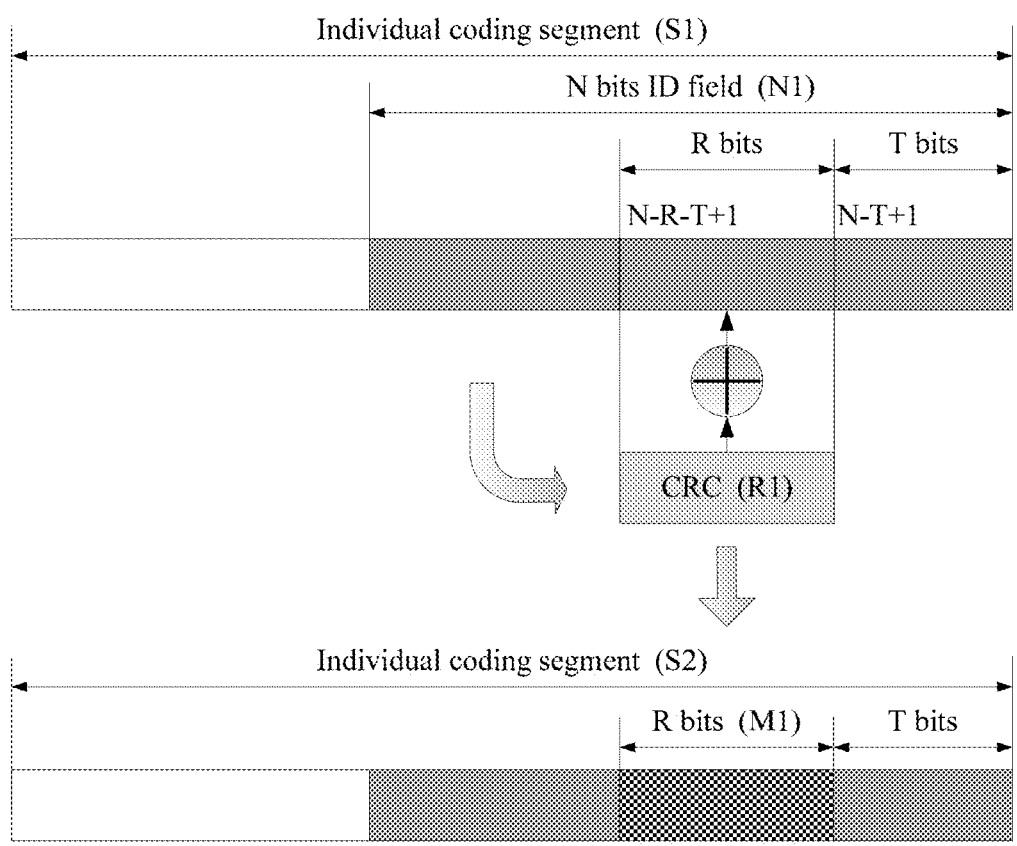

Referring to FIG. 13, in Embodiment 3, at an AP side,

It should be noted that a processing procedure in Embodiment 3 is consistent with that in Embodiment 2. Because a difference is that N is greater or equal to (T+R), the processed to-be-encoded sequence S2 may further include some bits that are not specially processed. The method includes the following steps.

500: Determine a to-be-processed individual coding segment (or known as an individual coding sequence) (individual coding segment) S1, where S1 includes a first part (a blank part of S1 in FIG. 13) and an identifier sequence N1.

Content of the first part is not limited or detailed. An N (for example N=12 or N=16) bits A identifier sequence N1 is at a tail of the individual coding sequence S1. It should be understood that the A identifier sequence N1 may be a normal-order original ID sequence N0 or a reverse-order original ID sequence N0.

502: Generate an R-bit CRC sequence R1 according to the to-be-processed individual coding sequence S1.

504: Perform a logical bitwise operation (for example, an XOR operation) on the protocol-defined R-bit sequence (for example, a sequence of the $(N-R-T+1)^{th}$ to the $(N-T)^{th}$ bits) in the identifier sequence N1 and the CRC sequence R1 to obtain an R-bit multiplex sequence M1.

506: Substitute the multiplex sequence M1 for the protocol-defined R information bits in the identifier sequence N1 to obtain a processed individual coding sequence S2.

It should be understood that, as mentioned in the foregoing implementations, the protocol-defined R-bit sequence in the N1 may be a more preceding sub-sequence. The sub-sequence may alternatively be a sequence including R nonconsecutive information bits in the N1, for example, a sequence of the $1^{st}$ to the $R^{th}$ bits in the identifier sequence N1 or a sequence with an odd-numbered R-bit length.

508: Substitute the sequence M1 for the $(N-R-T+1)^{th}$ to the $(N-T)^{th}$ information bits in the identifier sequence N1 to obtain a new individual coding sequence S2.

510: Set an initial state of a shift register of a BCC encoder to the last T information bits of the new individual coding segment, and perform TBCC encoding on the individual coding segment, to obtain an encoded sequence S3.

Figure 14:
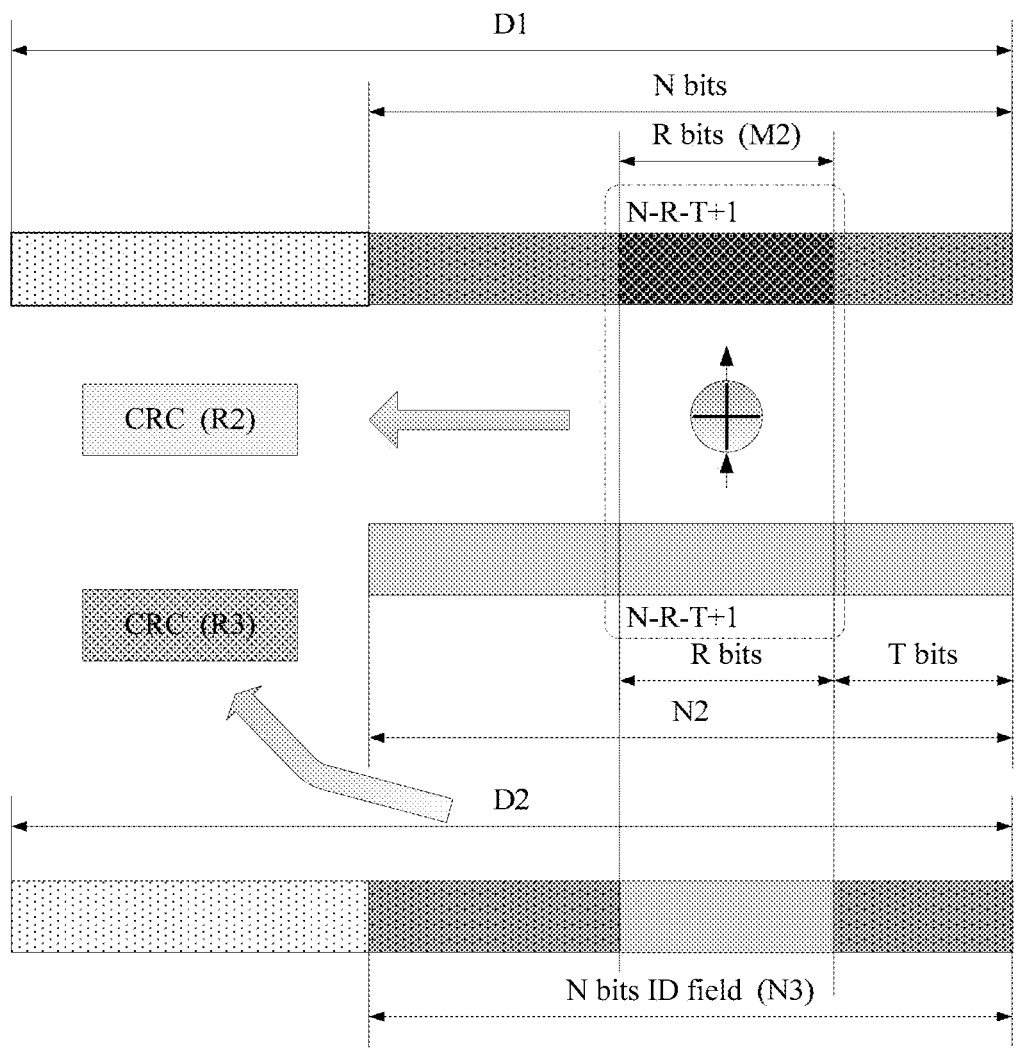

Referring to FIG. 14, in Embodiment 3, at an STA side,

600: Receive a to-be-decoded sequence D1.

601: Obtain an N-bit local ID sequence N2 according to a BSSID sequence stored on a receive end.

602: Set an initial state and a final state of a shift register of a BCC decoder to a reference state sequence with a T length, where the reference state sequence with a T length includes the $(N-T+1)^{th}$ to the $N^{th}$ bits in the local ID sequence N2; and perform decoding on the received individual coding segment to obtain a decoded sequence D1, where protocol-defined R bits (for example, the $(N-R-T+1)^{th}$ to the $(N-T)^{th}$ bits of the last N bits) in the D1 are a multiplex sequence M2.

604: Perform a logical reverse operation (for example, an XOR operation) on the multiplex sequence M2 and a protocol-defined R-bit sequence (for example, the $(N-R-T+1)^{th}$ to the $(N-T)^{th}$ bits) of the local ID sequence N2, to obtain an R-bit CRC sequence R2.

606: Substitute the protocol-defined R bits (for example, the $N-R-T+1)^{th}$ to the $(N-T)^{th}$ bits) of the local ID sequence N2 for the M2 sequence to obtain an information sequence D2 used for reference, where an N-bit sequence at a tail of the sequence D2 is a reference sequence N3. Generate an R-bit CRC sequence R3 according to the sequence D2.

608: Perform processing according to the obtained CRC sequence R2 and the reference CRC sequence R3, as well as conditions of the local ID sequence N2 and the reference sequence N3.

If the obtained CRC sequence R2 is identical to the reference CRC sequence R3 and the local ID sequence N2 is identical to the reference sequence N3, the sequence D2 is an information sequence required by the receive end and the receive end proceeds to subsequent processing. Otherwise, the sequence D2 is an information sequence not required by the receive end, and the information sequence D2 may be discarded or the processing may be stopped. It should be noted that, if N is greater than (T+R) in this implementation, the reference sequence N3 may still be incorrectly decoded. Therefore, preferably, it is further considered whether the local ID sequence N2 is identical to the reference sequence N3.

In the foregoing implementations, on one hand, a bit-carrying ID sequence and a CRC sequence are multiplexed.

In addition, because the receive end already knows that the final state of the decoder is several bits of the ID (station ID information or ID information of a BSS that the station is in), decoding performance of an individual coding segment can be further improved.

Embodiment 4

Different from the foregoing implementations, in this implementation, an individual coding sequence S2 does not include multiplex bits. That is, a CRC sequence in Embodiment 4 is not multiplexed and carried on some bits in a second part but explicitly included in a first part of the individual coding sequence S2.

In an example of this embodiment, the individual coding sequence S2 is a common part of an HE-SIG-B, and a BSSID the S2 carries is a sequence of an N=48 bits length or a BSS color of an N length.

In another example of this embodiment, the individual coding sequence S2 is each segment of station-based or RU-based configuration information in a dedicated part of the HE-SIG-B, and an AID the S2 carries is a sequence of an N=16 bits length.

Figure 15A:
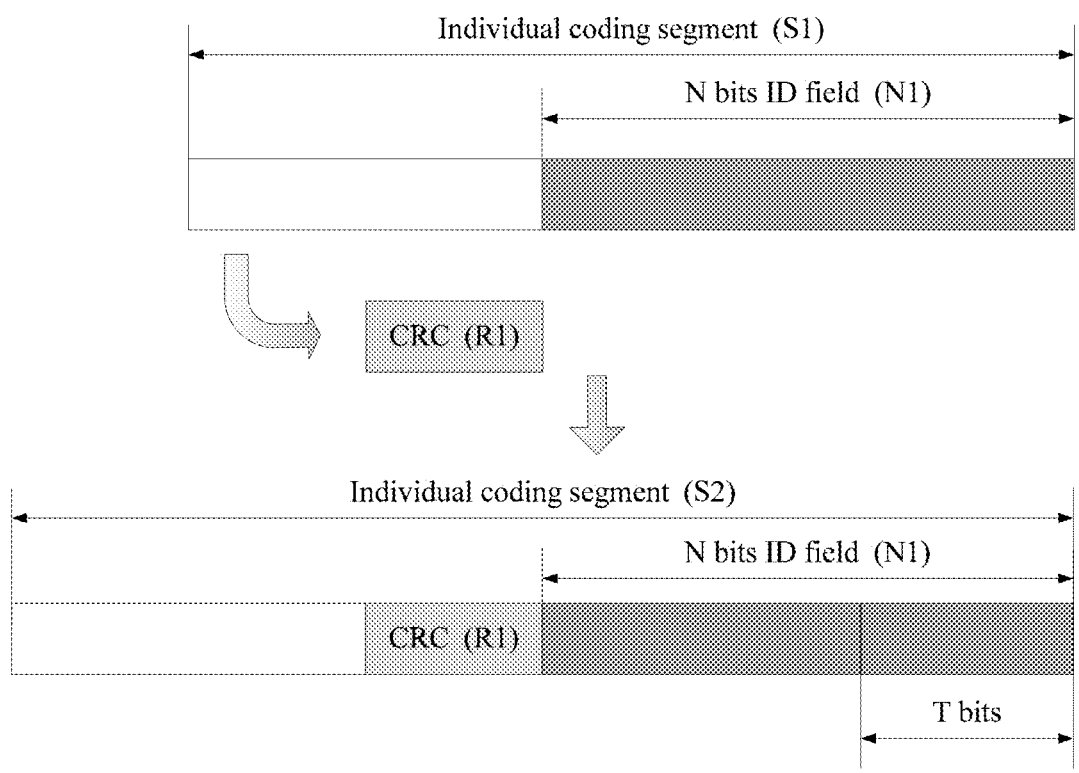
Figure 15B:
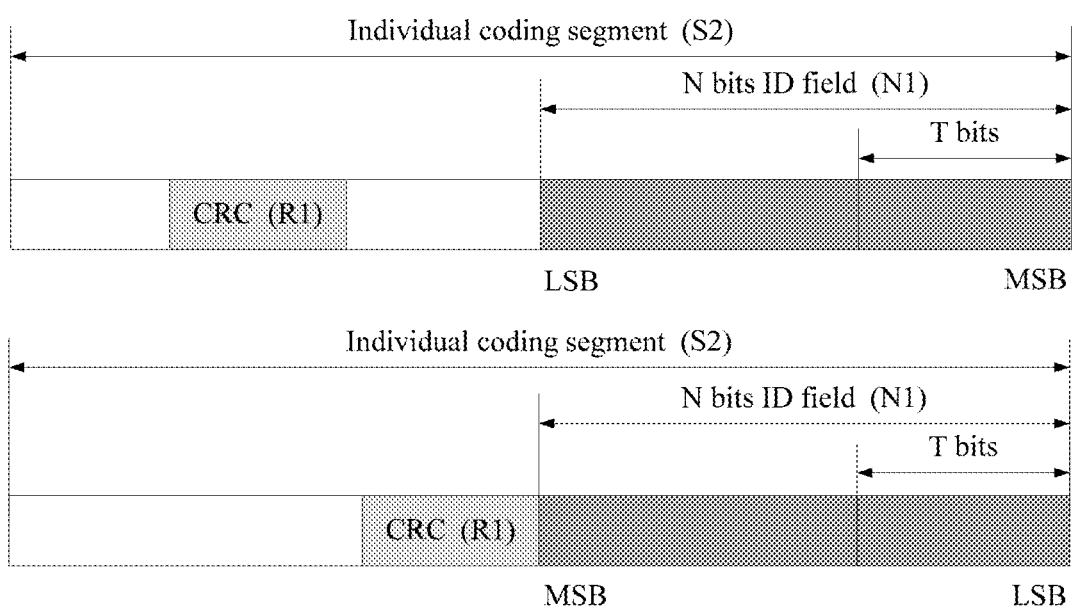

Referring to schematic diagrams shown in FIG. 15a and FIG. 15b, in Embodiment 4, at an AP side,

701: Determine an individual coding sequence as S1, where an N=16 bits identifier sequence N1 is at a tail of the individual coding sequence S1.

It should be understood that the identifier sequence N1 is obtained according to an original AID or PAID sequence N0 that is related to the individual coding sequence, for example, a normal-order original AID or PAID sequence or a reverse-order original AID or PAID sequence.

702: Generate an R=8 bits CRC sequence R1 according to the individual coding sequence S1.

The CRC sequence R1 is located before the identifier sequence N1, and a new individual coding sequence S2 is obtained.

It should be understood that the CRC sequence R1 may be located in any position before the sequence N1, for example, a position shown in FIG. 15b.

703: Set an initial state of a shift register of an encoder to the last T information bits of the new individual coding segment S2 and perform TBCC encoding on the individual coding segment, to obtain an encoded sequence S3.

Figure 16:
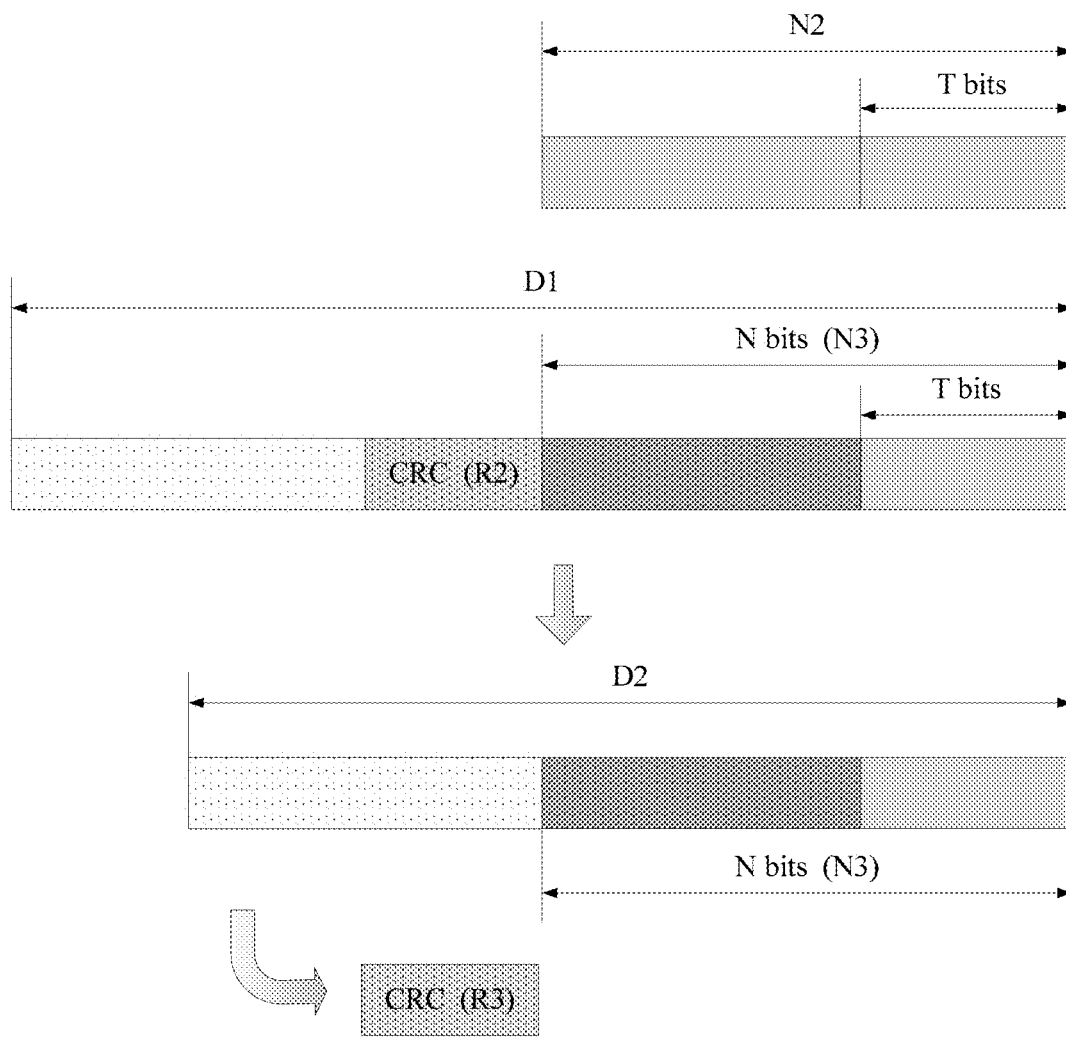

Referring to a schematic diagram shown in FIG. 16, in Embodiment 4, at an STA side,

801: Obtain an N-bit AID sequence N2 according to ID information stored on a receive end.

According to a protocol definition, the AID sequence N2 may be a normal-order sequence of the original AID sequence N0 or a reverse-order sequence of the original AID sequence N0.

802: Set a final state of a shift register of a decoder to the last T bits of the sequence N2 and perform decoding on the received individual coding segment, to obtain a decoded sequence D1, where a sequence of the last N bits in the D1 is a sequence N3.

A person skilled in the art may understand that the initial state of the decoder is a normal-order high-order sequence or a reverse-order low-order sequence of the AID sequence N0, and a length of the sequence is T.

803: Remove an R-bit CRC sequence R2 in the sequence D1 from a position (a protocol-defined position) corresponding to a transmit side, to obtain a new information sequence D2.

804: Generate an R-bit CRC sequence R3 according to the sequence D2.

805: If the sequence R2 is identical to the sequence R3 and the sequence N2 is identical to the N3 sequence, the sequence D2 is an information sequence required by the receive end. Otherwise, the sequence D2 may be discarded.

Embodiment 5

Different from the foregoing implementations, for a signaling sub-segment, reference state sequences (second parts) of individual coding segments of the sub-segment are each a segment of an ID sequence corresponding to the signaling sub-segment. These segments are included in the individual coding segments sequentially in a normal order or a reverse order.

For example, a common part of an HE-SIG-B is an individual coding segment, and each segment of station-based or RU-based configuration in a dedicated part of the HE-SIG-B is an individual coding segment. All individual coding segments in the HE-SIG-B together carry a BSSID sequence of an N=48 bits length.

Figure 17:
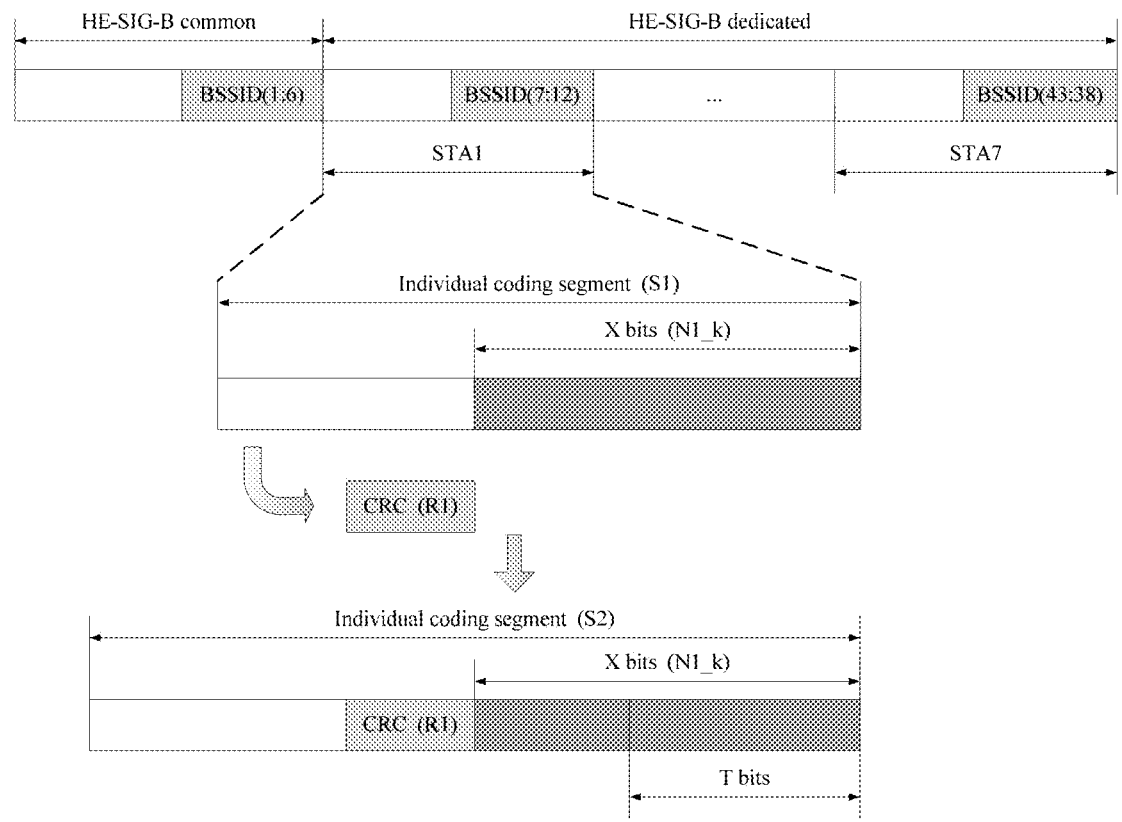

Referring to a schematic diagram shown in FIG. 17, in Embodiment 5, at an AP side, It is assumed that a signaling sub-segment HE-SIG-B altogether has K individual coding segments, that is, S=⌊N/T⌋.

901: Determine a to-be-processed individual coding sequence as S1, which is in the $k^{th}$ position in all the K individual coding segments, where k=1, 2, . . . , K.

If K is greater than or equal to S: when k is not equal to an integer multiple of S, a sequence N1_k of the $((k-1) \bmod S)*T+1^{th}$ to the $((k-1) \bmod S)*T+T^{th}$ bits in an N-bit BSSID sequence N1 is at a tail of the individual coding sequence S1, and a length of the sequence N1_k is X=T; when k is equal to an integer multiple of S, a sequence N1_k of the $((k-1) \bmod S)*T+1^{th}$ to the $N^{th}$ bits in the N-bit BSSID sequence N1 is at the tail of the individual coding sequence S1, and in this case, the length of the sequence N1_k is X>T.

In a specific example, when N=48, T=6, and S=8, as shown in FIG. 17, the common part of the HE-SIG-B carries the $1^{st}$ to the $6^{th}$ bits in the BSSID, the first individual coding segment in the dedicated part of the HE-SIG-B carries the $7^{th}$ to the $12^{th}$ bits in the BSSID, and by analogy, the $7^{th}$ individual coding segment in the dedicated part of the HE-SIG-B carries the $43^{rd}$ to the $48^{th}$ bits in the BSSID.

It should be understood that, according to another protocol rule, the sequence N1_k may be removed from the N1 and placed at the tail of S1. For example, the common part of the HE-SIG-B carries the $48^{th}$ to the $43^{rd}$ bits in the BSSID, the first individual coding segment in the dedicated part of the HE-SIG-B carries the $42^{nd}$ to the $37^{th}$ bits in the BSSID, and by analogy, the $7^{th}$ individual coding segment in the dedicated part of the HE-SIG-B carries the $6^{th}$ to the $1^{st}$ bits in the BSSID.

If K is less than S: when k is less than K, the sequence N1_k of the $((k-1) \bmod S)*T+1^{th}$ to the $((k-1) \bmod S)*T+T^{th}$ bits in the N-bit BSSID sequence N1 is at the tail of the individual coding sequence S1, and the length of the N1_k sequence is X=T; when k is equal to K, the sequence N1_k of the $((k-1) \bmod S)*T+1^{th}$ to the $N^{th}$ bits in the N-bit BSSID sequence N1 is at the tail of the individual coding sequence S1, and in this case the length of the sequence N1_k is X>T.

902: Generate an R=8 bits CRC sequence R1 according to the individual coding sequence S1.

903: Place the CRC sequence R1 is located before the sequence N1_k, to obtain a new individual coding sequence S2.

It should be understood that the CRC sequence R1 may be located in any position before the sequence N1_k.

904: Set an initial state of a shift register of an encoder to the last T information bits of the new individual coding segment S2 and perform TBCC encoding on the individual coding segment, to obtain an encoded sequence S3.

In Embodiment 5, at an STA side,

1101: Receive a to-be-decoded signaling sub-segment, where the to-be-decoded signaling sub-segment includes one or more to-be-decoded sequences D0.

1102: Obtain an N-bit sequence N2 corresponding to the signaling sub-segment according to ID information stored on a receive end.

For example, a normal-order sequence or a reverse-order sequence of a BSSID sequence corresponding to the signaling sub-segment is obtained.

1103: Determine that the to-be-decoded sequence D0 is in the $k^{th}$ position in all individual coding segments included in an HE-SIG-B. According to a rule on a transmit side, set an initial state and a final state of a shift register of a decoder to bits in a sequence N2_k of the sequence N2 and perform decoding on the received individual coding segments, to obtain a decoded sequence D1.

1104: Remove an R-bit CRC sequence R2 in the sequence D1 from a position corresponding to the transmit side, to obtain a new information sequence D2.

1105: Generate an R-bit CRC sequence R3 according to the sequence D2.

1106: If the sequence R2 is identical to the sequence R3, proceed to further processing of determining whether the sequence D2 is an information sequence required by the receive end. If the sequence D2 is an information sequence required by the receive end, continue the processing according to the existing rule. If the sequence D2 is an information sequence not required by the receive end, return to step 2 to continue to decode a subsequent individual coding segment. If the sequence R2 is not identical to the sequence R3, stop the processing.

Figure 18:
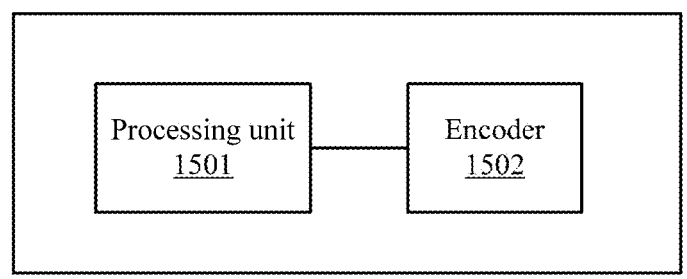
FIG. 18 is a simple schematic structural diagram of a processing apparatus in the present disclosure.

Accordingly, referring to FIG. 18, another implementation provides an apparatus that is capable of processing a signaling sub-segment. The apparatus may be provided at an access point in a wireless local area network, including:

a processing unit (1501), configured to process a to-be-encoded signaling sub-segment, where the processed signaling sub-segment includes one or more individual coding sequences S2, each processed individual coding sequence S2 includes a first part and includes a second part with an N-bit length, and the second part is a sequence obtained according to an identifier sequence N1, with an N-bit length, that is related to the signaling sub-segment or each individual coding segment; and an encoder (1502), configured to perform encoding for each individual coding sequence S2, where an initial state of the encoder is set to a tail bit sequence with a T length, where T bits at a tail of the individual coding sequence S2 are the tail bit sequence, and at least some bits in the tail bit sequence are identical to some bits in the identifier sequence N1, referred to as a specific tail bit sequence in short.

Accordingly, not shown in the figure, another implementation provides an apparatus that is capable of processing a signaling sub-segment. The apparatus may be provided at a station in a wireless local area network, including:

a processing unit (1601), configured to receive a to-be-decoded signaling sub-segment, where the to-be-decoded signaling sub-segment includes one or more to-be-decoded sequences D0; obtain a local ID sequence N2 with an N-bit length according to ID information stored on a receive end; and perform processing according to a decoding result; and a decoder (1602), configured to obtain a decoded sequence D1 for each to-be-decoded sequence D0, where an initial state and a final state of the decoder are set to a reference state sequence with a T length, and at least some bits in the reference state sequence are identical to some bits in the obtained local ID sequence N2, referred to as a specific reference state sequence in short.

For specific processing procedures and results, refer to the foregoing implementations, and details are not described herein again. The processing unit (1501 or 1601) may be a universal processor, a digital signal processor, a dedicated integrated circuit, a field programmable gate array or another programmable logic device, a discrete gate or a transistor logic device, or a discrete hardware component. The processing unit may implement or execute the methods, steps, or logical schematic diagrams disclosed in the embodiments of the present disclosure. The universal processor may be a microprocessor or any conventional processor, or the like. The steps of the methods disclosed with reference to the embodiments of the present disclosure may be directly implemented by a hardware processor or by a combination of hardware and software modules in the processor. It is easily understood that the processing apparatus indicated by the foregoing resources may be at an access point when the apparatus is specifically configured to send a frame including a resource indication field; or may be at a station when the apparatus is specifically configured to receive a frame including the resource indication field.

Figure 19:
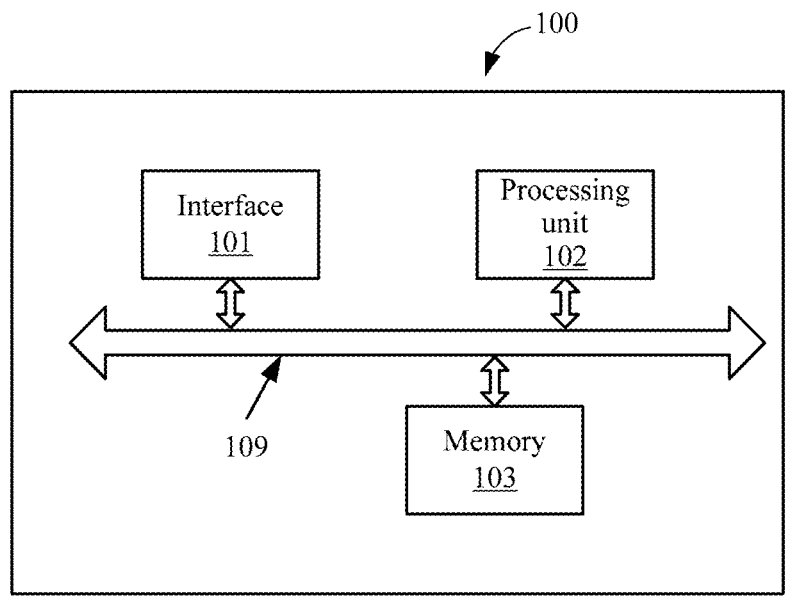
FIG. 19 is a block diagram of an access point in an embodiment of the present disclosure.

FIG. 19 is a schematic diagram of an access point in another embodiment of the present disclosure. The access point in FIG. 19 includes an interface 101, a processing unit 102, and a memory 103. The processing unit 102 controls operations of the access point 100. The memory 103 may include a read-only memory and a random access memory, and provides instructions and data to the processing unit 102. Apart of the memory 103 may further include a nonvolatile random access memory (NVRAM). Components of the access point 100 are coupled together by using a bus system 109. The bus system 109 includes not only a data bus but also a power bus, a control bus, and a state signal bus. However, for clear description, all buses in the figure are marked as the bus system 109.

The signaling processing and encoding methods disclosed in the foregoing embodiments of the present disclosure may be applied to the processing unit 102 or be implemented by the processing unit 102. During an implementation process, the steps of the foregoing methods may be implemented by using an integrated logic circuit of hardware in the processing unit 102, or by using software instructions. The processing unit 102 may be a universal processor, a digital signal processor, a dedicated integrated circuit, a field programmable gate array or another programmable logic device, a discrete gate or a transistor logic device, or a discrete hardware component. The processing unit 102 may implement or execute the methods, steps, or logical schematic diagrams disclosed in the embodiments of the present disclosure. The universal processor may be a microprocessor or any conventional processor, or the like. The steps of the methods disclosed with reference to the embodiments of the present disclosure may be directly implemented by a hardware processor or by a combination of hardware and software modules in the processor. The software module may be in a random access memory, a flash memory, a read-only memory, a programmable read-only memory or an erasable programmable memory, a register, or another mature storage medium in the art. The storage medium is in the memory 103, and the processing unit 102 reads information in the memory 103 and implements, in combination with its hardware, the steps of the foregoing methods.

Figure 20:
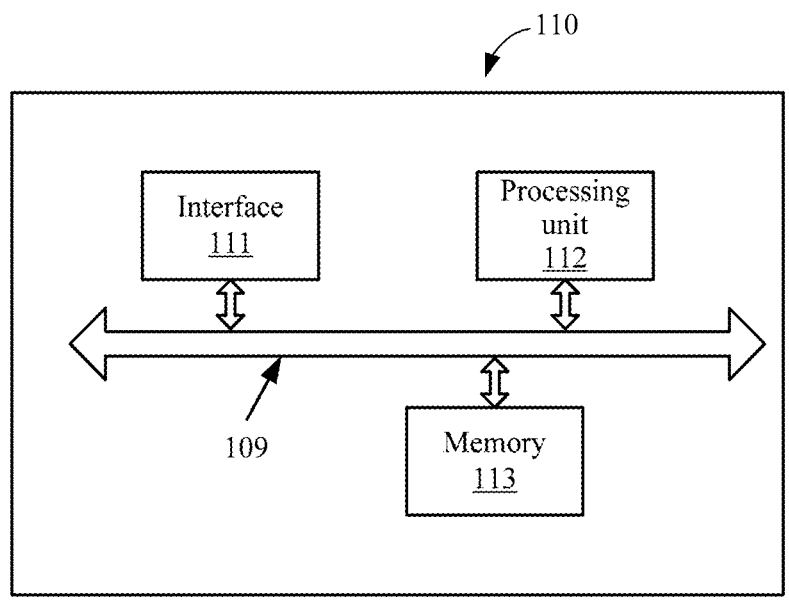
FIG. 20 is a block diagram of a station in an embodiment of the present disclosure.

FIG. 20 is a schematic diagram of a station in another embodiment of the present disclosure. The access point in FIG. 20 includes an interface 111, a processing unit 112, and a memory 113. The processing unit 112 controls operations of the station 110. The memory 113 may include a read-only memory and a random access memory, and provides instructions and data to the processing unit 112. Apart of the memory 113 may further include a nonvolatile random access memory (NVRAM). Components of the station 110 are coupled together by using a bus system 119. The bus system 119 includes not only a data bus but also a power bus, a control bus, and a state signal bus. However, for clear description, all buses in the figure are marked as the bus system 119.

The signaling processing and decoding methods disclosed in the foregoing embodiments of the present disclosure may be applied to the processing unit 112 or be implemented by the processing unit 112. During an implementation process, the steps of the foregoing methods may be implemented by using an integrated logic circuit of hardware in the processing unit 112, or by using software instructions. The processing unit 112 may be a universal processor, a digital signal processor, a dedicated integrated circuit, a field programmable gate array or another programmable logic device, a discrete gate or a transistor logic device, or a discrete hardware component. The processing unit 112 may implement or execute the methods, steps, or logical schematic diagrams disclosed in the embodiments of the present disclosure. The universal processor may be a microprocessor or any conventional processor, or the like. The steps of the methods disclosed with reference to the embodiments of the present disclosure may be directly implemented by a hardware processor or by a combination of hardware and software modules in the processor. The software module may be in a random access memory, a flash memory, a read-only memory, a programmable read-only memory or an erasable programmable memory, a register, or another mature storage medium in the art. The storage medium is in the memory 113, and the processing unit 112 reads information in the memory 113 and implements, in combination with its hardware, the steps of the foregoing methods.

Specifically, the memory 113 stores instructions that make the processing unit 112 perform the following operations: determining resource status information, where the resource status information indicates a busy/idle state of a subresource of a channel resource for data transmission between an access point and the station; and sending the resource status information to the access point so that the access point allocates resources according to the resource status information.

It should be understood that "one embodiment" or "an embodiment" mentioned throughout the specification indicates that a particular characteristic, structure or property that is related to the embodiment is included in at least one embodiment of the present disclosure. Therefore, "in one embodiment" or "in an embodiment" that appears throughput the entire specification does not necessarily mean a same embodiment. Moreover, the particular characteristic, structure or property may be combined in one or more embodiments in any proper manner. Sequence numbers of the foregoing processes do not mean execution sequences in the embodiments of the present disclosure. The execution sequences of the processes should be determined according to functions and internal logic of the processes, and should not be construed as any limitation on the implementation processes of the embodiments of the present disclosure.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that in the embodiments of the present disclosure, "B corresponding to A" indicates that B is associated with A, and B may be determined according to A. However, it should further be understood that determining B according to A does not mean that B is determined according to A only; that is, B may also be determined according to A and/or other information.

A person of ordinary skill in the art may be aware that the units and algorithm steps in the examples described with reference to the embodiments disclosed in this specification may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but such implementation should not be considered as to go beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiments are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present disclosure.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

With descriptions of the foregoing embodiments, a person skilled in the art may clearly understand that the present disclosure may be implemented by hardware, firmware or a combination thereof. When the present disclosure is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a computer. The following provides an example but does not impose a limitation: The computer-readable medium may include a RAM, a ROM, an EEPROM, a CD-ROM, or another optical disc storage or disk storage medium, or another magnetic storage device, or any other medium that can carry or store expected program code in a form of an instruction or a data structure and can be accessed by a computer. In addition, any connection may be appropriately defined as a computer-readable medium. For example, if software is transmitted from a website, a server or another remote source by using a coaxial cable, an optical fiber/cable, a twisted pair, a digital STA line (DSL) or wireless technologies such as infrared ray, radio and microwave, the coaxial cable, optical fiber/cable, twisted pair, DSL or wireless technologies such as infrared ray, radio and microwave are included in a definition of a medium to which they belong. For example, a disk and disc used by the present disclosure includes a compact disc (CD), a laser disc, an optical disc, a digital versatile disc (DVD), a floppy disk and a Blu-ray disc, where the disk generally copies data by a magnetic means, and the disc copies data optically by a laser means. The foregoing combination should also be included in the protection scope of the computer-readable medium.

In conclusion, what have been described are merely exemplary embodiments of the technical solutions of the present disclosure, but are not intended to limit the protection scope of the present disclosure. Any modification, equivalent replacement, or improvement made without departing from the spirit and principle of the present disclosure shall fall within the protection scope of the present disclosure.

What is claimed is:

1. A method for processing signaling in a wireless local area network, the method comprising:
   processing a to-be-encoded signaling sub-segment comprising one or more to-be-processed individual coding sequences S1, the processed to-be-encoded signaling sub-segment comprising one or more individual coding sequences S2 each corresponding to one of the to-be-processed individual coding sequences S1 and comprising a first part and a second part, the second part having an N-bit length, wherein the second part is a sequence obtained according to an identifier sequence N1, with an N-bit length, that is derived based on an identifier of an intended receive end corresponding to the signaling sub-segment or each individual coding sequence; and
   for each individual coding sequence S2, setting an initial state of an encoder to a tail bit sequence with a T length and performing encoding, wherein T bits at a tail of the individual coding sequence S2 are the tail bit sequence, and at least some bits in the tail bit sequence are identical to some bits in the identifier sequence N1.

2. The method according to claim 1, wherein the first part further comprises a cyclic redundancy check (CRC) sequence R1 with an R-bit length, wherein the CRC sequence R1 is obtained according to at least a part of the corresponding to-be-processed individual coding sequences S1 and the identifier sequence N1.

3. The method according to claim 1, wherein the second part is a sequence obtained according to the identifier sequence N1, with an N-bit length, that is derived based on the identifier of the intended receive end corresponding to the signaling sub-segment, and the second part is a segment of the identifier sequence N1 corresponding to the signaling sub-segment.

4. The method according to claim 1, wherein:
   the second part further comprises a multiplex sequence with an R-bit length and located before a specific that comprises the bits in the tail bit sequence that are identical to some bits in the identifier sequence N1; and
   the multiplex sequence comprises bits obtained after a logical bitwise operation is performed on R bits in a protocol-defined position of the identifier sequence N1 and a cyclic redundancy check (CRC) sequence with an R-bit length.

5. The method according to claim 4, wherein the CRC sequence R1 is obtained according to at least a part of the corresponding to-be-processed individual coding sequence S1 and the identifier sequence N1.

6. An apparatus for processing signaling in a wireless local area network, the apparatus comprising:
   a processor, configured to process a to-be-encoded signaling sub-segment comprising one or more to-be-processed individual coding sequences S1, the processed to-be-encoded signaling sub-segment comprising one or more individual coding sequences S2 each corresponding to one of the to-be-processed individual coding sequences S1 and comprising a first part and a second part, the second part having an N-bit length, wherein the second part is a sequence obtained according to an identifier sequence N1, with an N-bit length, that is derived based on an identifier of an intended receive end corresponding to the signaling sub-segment or each individual coding sequence; and
   an encoder, configured to perform encoding for each individual coding sequence S2, wherein an initial state of the encoder is set to a tail bit sequence with a T length, T bits at a tail of the individual coding sequence S2 are the tail bit sequence, and at least some bits in the tail bit sequence are identical to some bits in the identifier sequence N1.

7. The apparatus according to claim 6, wherein the first part further comprises a cyclic redundancy check (CRC) sequence R1 with an R-bit length obtained according to at least a part of the corresponding to-be-processed individual coding sequence S1 and the identifier sequence N1.

8. The apparatus according to claim 7, wherein the second part is a sequence obtained according to the identifier sequence N1, with an N-bit length, that is derived based on the identifier of the intended receive end corresponding to the signaling sub-segment, and the second part is a segment of the identifier sequence N1 corresponding to the signaling sub-segment.

9. The apparatus according to claim 6, wherein:
   the second part further comprises a multiplex sequence with an R-bit length and located before a specific tail bit sequence that comprises the bits in the tail bit sequence that are identical to some bits in the identifier sequence N1; and the multiplex sequence comprises bits obtained after a logical bitwise operation is performed on R bits in a protocol-defined position of the identifier sequence N1 and a CRC sequence with an R-bit length.

* * * * *

UNITED STATES PATENT AND TRADEMARK OFFICE
CERTIFICATE OF CORRECTION

PATENT NO. : 10,623,140 B2  
APPLICATION NO. : 15/812903  
DATED : April 14, 2020  
INVENTOR(S) : Jiayin Zhang, Jun Zhu and Jiyong Pang Page 1 of 1

It is certified that error appears in the above-identified patent and that said Letters Patent is hereby corrected as shown below:

In the Claims

In Claim 4, Column 18, Line 19, replace "located before a specific that" with --located before a specific tail bit sequence that--.

Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*